United States Patent
Ye et al.

(10) Patent No.: US 9,893,761 B2
(45) Date of Patent: Feb. 13, 2018

(54) SIGNAL ROUTING WITH REDUCED CROSSTALK

(71) Applicant: Intel Corporation, Santa Clara, CA (US)

(72) Inventors: Xiaoning Ye, Portland, OR (US); Yunhui Chu, Portland, OR (US); Zhenwei Yu, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 56 days.

(21) Appl. No.: 14/496,569

(22) Filed: Sep. 25, 2014

(65) Prior Publication Data
US 2016/0094272 A1   Mar. 31, 2016

(51) Int. Cl.
*H04B 3/32* (2006.01)
*H05K 1/02* (2006.01)

(52) U.S. Cl.
CPC ............. *H04B 3/32* (2013.01); *H05K 1/0216* (2013.01); *H05K 2201/09727* (2013.01)

(58) Field of Classification Search
CPC .. H05K 1/0224; H05K 1/0225; H05K 1/0227; H05K 1/0228; H05K 1/0216; H05K 1/0218; H05K 1/0219; H05K 1/023; H01L 2223/6627; H01L 23/49827; H01P 3/081; H01P 3/08; H04B 3/32
See application file for complete search history.

(56) References Cited

U.S. PATENT DOCUMENTS

| | | | |
|---|---|---|---|
| 2003/0146811 A1* | 8/2003 | Breisch | H01P 3/088 333/247 |
| 2005/0237126 A1* | 10/2005 | Babb | H01P 3/08 333/34 |
| 2010/0327989 A1* | 12/2010 | Abbott | H03H 7/38 333/1 |
| 2011/0090028 A1* | 4/2011 | Park | H01P 3/081 333/238 |

FOREIGN PATENT DOCUMENTS

WO   WO 2013101127 A1 *   7/2013   ............. H01L 23/64

* cited by examiner

*Primary Examiner* — David S Huang
(74) *Attorney, Agent, or Firm* — Grossman, Tucker, Perreault & Pfleger, PLLC (57) ABSTRACT

Generally, this disclosure provides systems and devices for reduction of crosstalk between routed signals. A system may include a first pair of signal lines and a second pair of signal lines and each of the pairs of signal lines include a positive signal line and a negative signal line to transmit a differential signal. The system may also include an alternating current coupling capacitor (AC cap) associated with each of the positive signal lines and each of the negative signal lines. The system may further include a routing crossover of the positive signal line and the negative signal line of the second pair of signal lines, to decrease signal crosstalk between the first and second pairs of signal lines. The routing crossover may include at least one of the AC caps.

6 Claims, 9 Drawing Sheets

SIGNAL ROUTING WITH REDUCED CROSSTALK

FIELD

The present disclosure relates to signal routing, and more particularly, techniques for reduction of crosstalk between routed signals.

BACKGROUND

As electronic systems become increasingly complex, and processor clock speeds and corresponding signal frequencies increase, crosstalk between signal routing lines that interconnect the various components of the system becomes a greater problem. This crosstalk can degrade the integrity of the signals to a degree that is unacceptable. Solutions to reduce crosstalk typically involve an increase in the spacing between signal lines or the use of complex shielding mechanisms. These approaches are generally undesirable, however, as they increase the size and cost of the systems.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides systems and devices for reduction of crosstalk between routed signals. In one embodiment, the signal lines may be differential signals arranged as adjacent pairs of positive and negative signals. A routing crossover, between the positive and negative signals, may be employed on alternating pairs (e.g., every other pair) at a selected point along the signal lines. The selected point may, for example, be located at approximately the mid length point of the signal lines. The resulting differential far end crosstalk between adjacent pairs of signal lines may have substantially opposite values on each half of the lines providing crosstalk cancellation. In some embodiments, the selected point for the routing crossover may be located at other positions along the signal lines which may be chosen to adjust the amount of crosstalk cancellation associated with various components such as connectors, vias, sockets, etc.

In another embodiment, conductive pads may be coupled to the signal lines to increase capacitive coupling between adjacent signal lines. The capacitive coupling may serve to cancel out any existing inductive coupling that typically causes signal crosstalk.

In another embodiment, the signals lines may be disposed in a signal layer of a routing structure, such as, for example a microstrip. Conductive patches may be deployed in a second layer, parallel to the signal layer. These conductive patches may increase the mutual capacitance between signal lines and reduce the speed differences between even and odd modes of the signal propagation, which can be a primary cause of far end crosstalk.

Figure 1:
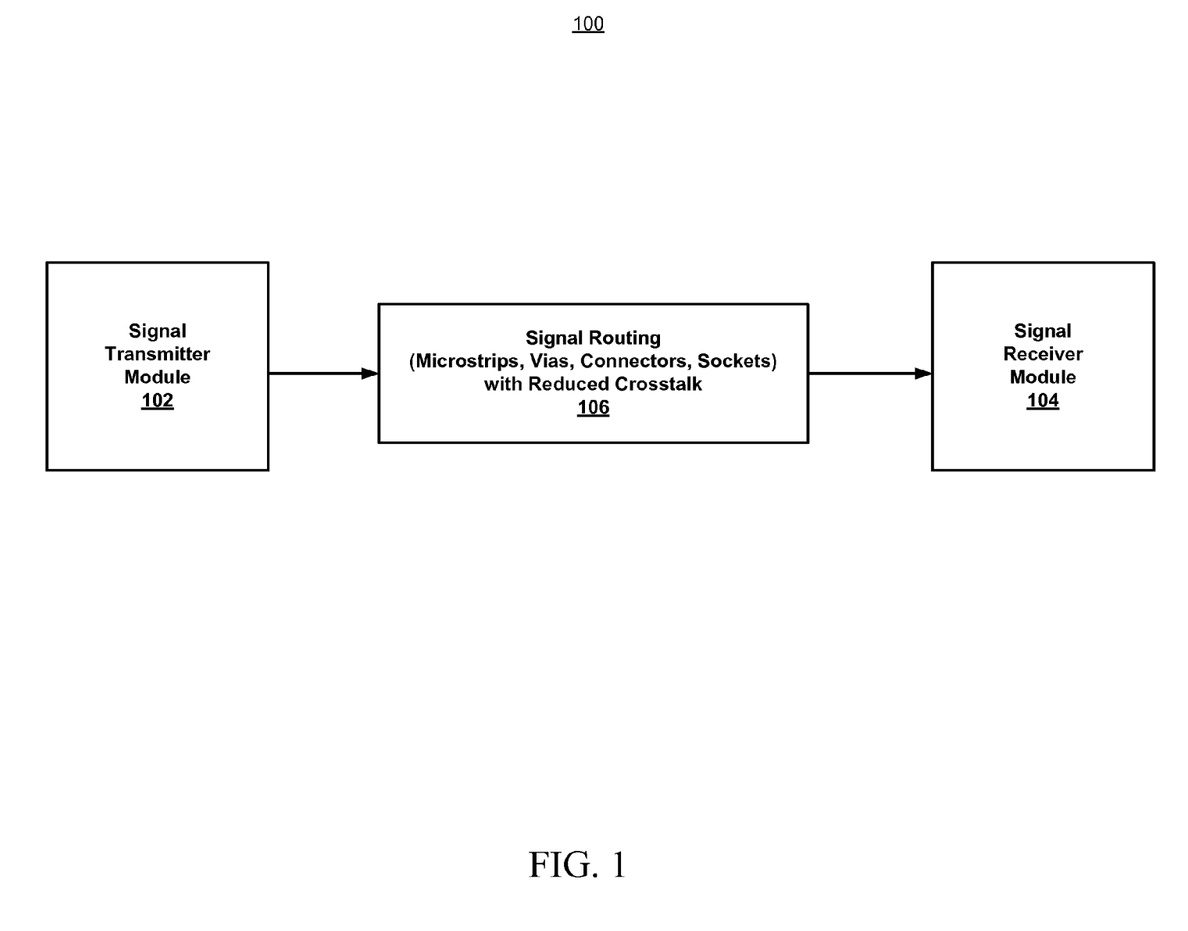
FIG. 1 illustrates a top level system diagram of one example embodiment consistent with the present disclosure.

FIG. 1 illustrates a top level system diagram 100 of one example embodiment consistent with the present disclosure. System 100 is shown to include one or more signal transmitter modules 102 and signal receiver modules 104 electrically coupled by a signal routing system 106 that provides communication or input/output (I/O) capability between the modules or other components of an electronic system. The signal routing system 106 may include multiple signal lines and may be configured for reduced signal crosstalk between lines, as will be explained in greater detail below. The term crosstalk generally refers to electromagnetic interference between one signal line and another, typically adjacent, signal line. Far end crosstalk generally refers to a measurement of this interference at the opposite end of the signal line from the transmitter, or source, of the interference.

Signal routing system 106 may include microstrips, striplines, vias, connectors and sockets or any combinations thereof. The modules 102, 104 and signal routing 106 may be part of an electronic device such as, for example, a smart phone, smart tablet, personal digital assistant (PDA), mobile Internet device (MID), convertible tablet, notebook, laptop computer, workstation or desktop computer.

Figure 2:
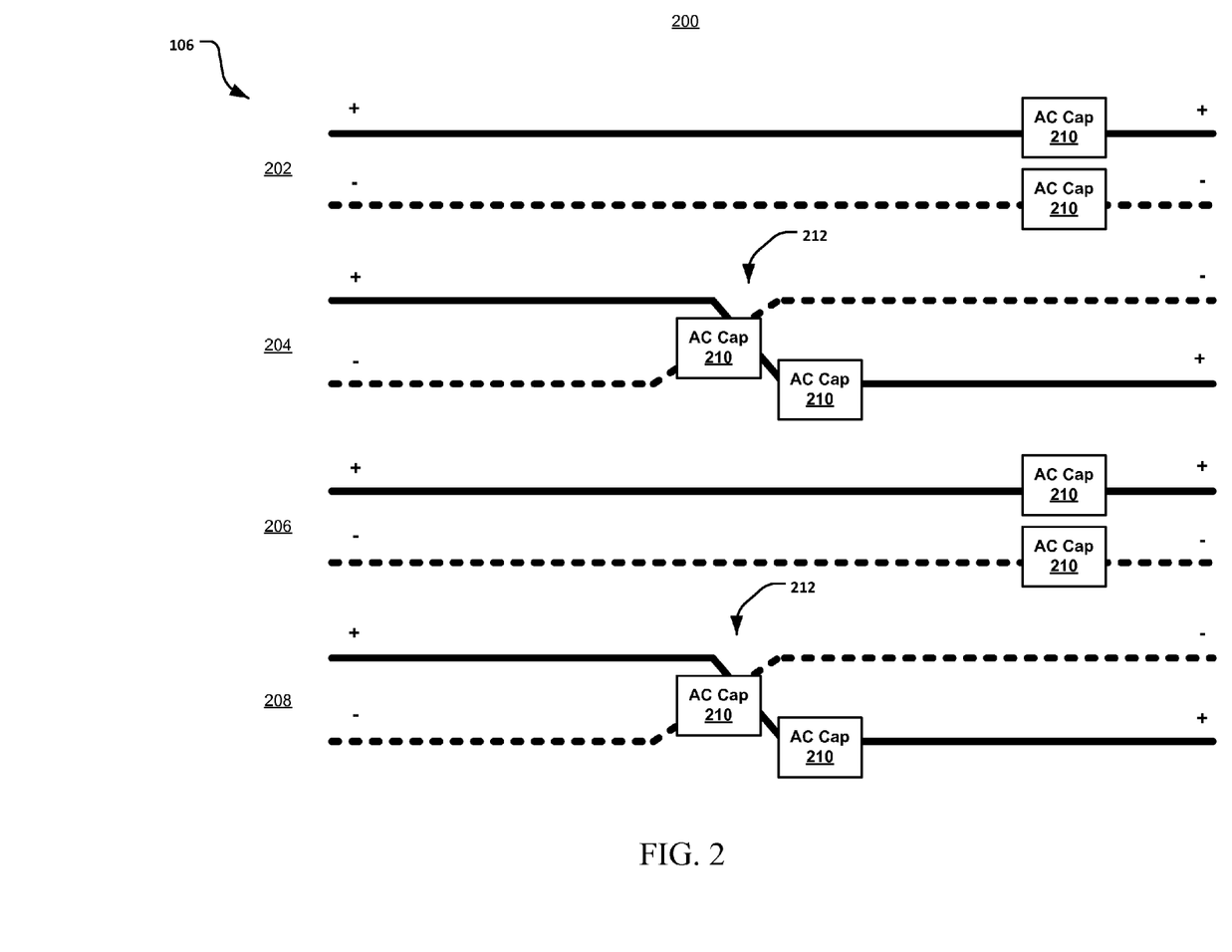
FIG. 2 illustrates a schematic diagram of an example embodiment of signal routing consistent with the present disclosure.

FIG. 2 illustrates a schematic diagram 200 of an example embodiment of signal routing consistent with the present disclosure. Signal routing system 106 is shown to include pairs of signal lines 202, 204, 206, 208, which may be configured as differential signal lines, each including a positive and negative signal line. Signal routing system 106 is shown to further include alternating current (AC) coupling capacitors (caps) 210 on each of the signal lines. Signal routing system 106 also includes routing crossovers 212 on alternate pairs (e.g., every other pair) of differential signal lines 204, 208. In some embodiments, the routing crossovers 212 may be located at approximately the mid points along the length of the signal lines. The resulting differential far end crosstalk of any two adjacent signal pairs on one side of the routing crossover (e.g., left side of FIG. 2) will have a substantially opposite value compared to the differential crosstalk of the same two pairs on the other side of the routing crossover (e.g., right side of FIG. 2). Thus, the total crosstalk of any two adjacent pairs of signals may sum to approximately zero. In other words, the crosstalk cancels out due to the routing crossover 212.

In some embodiments, the routing crossover 212 may be located at a selected point along the signal lines which may be chosen to adjust the amount of crosstalk cancellation based on the location of a circuit or link component (e.g., a connector, via, or socket) that generates the crosstalk. For example, if the polarity of the signal routing crosstalk is positive and the polarity of the component crosstalk is also positive, then it may be advantageous to move the crossover point closer to the connector. Similarly, if the polarity of the signal routing crosstalk is positive, but the polarity of the component crosstalk is negative, then it may be advantageous to move the crossover point farther away from the connector.

Figure 2A:
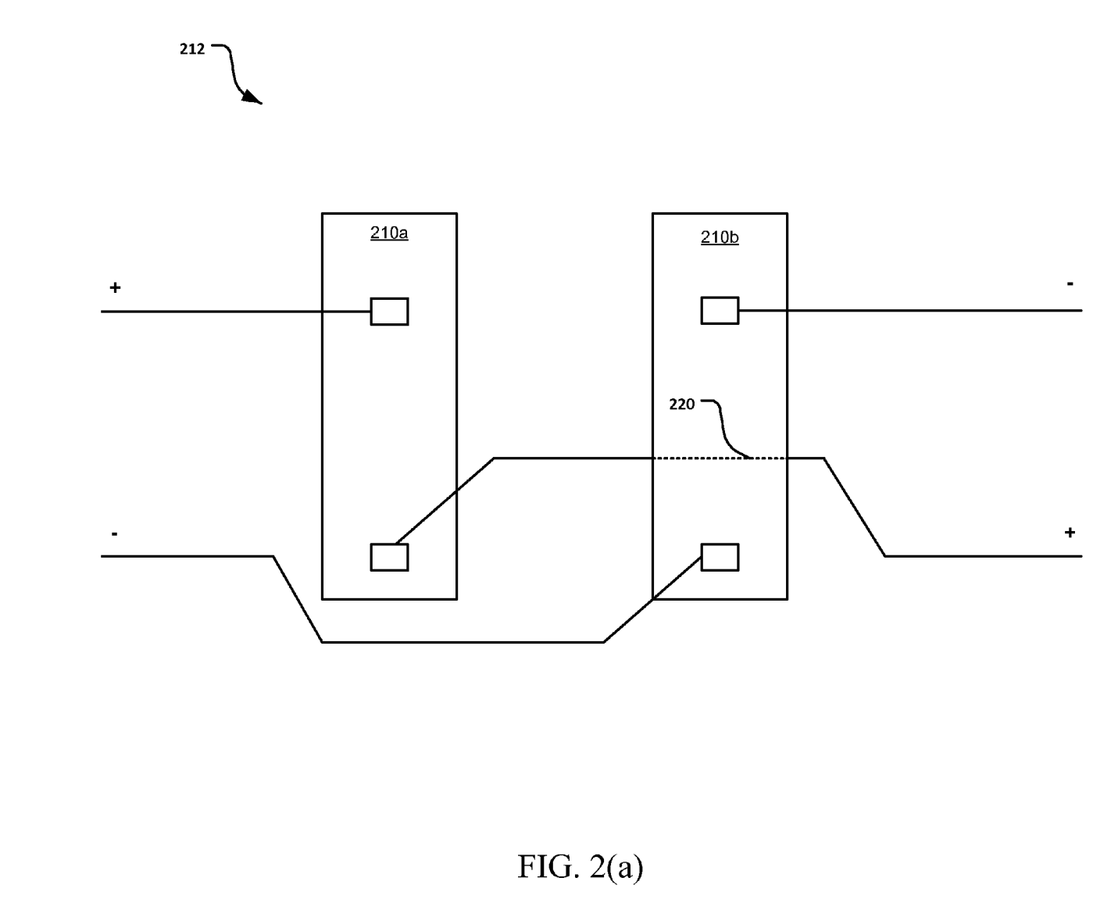
FIG. 2(a) illustrates a schematic diagram of another example embodiment of signal routing consistent with the present disclosure.

In some embodiments, the routing crossover 212 may be configured such that one of the signal lines, either the positive or negative line, may be routed beneath the other signal of the pair of signals, for example beneath one of the AC caps 210. This is illustrated in FIG. 2(a), where the routing crossover 212 is shown in greater detail to include a leftmost AC cap portion 210a and a rightmost AC cap portion 210b. Here it can be seen that the routing of the positive line 220 is beneath the rightmost AC cap portion 210b. Of course, in some embodiments, the crossover may route the negative line beneath the positive line (e.g., the leftmost AC cap portion 210a).

Figure 3:
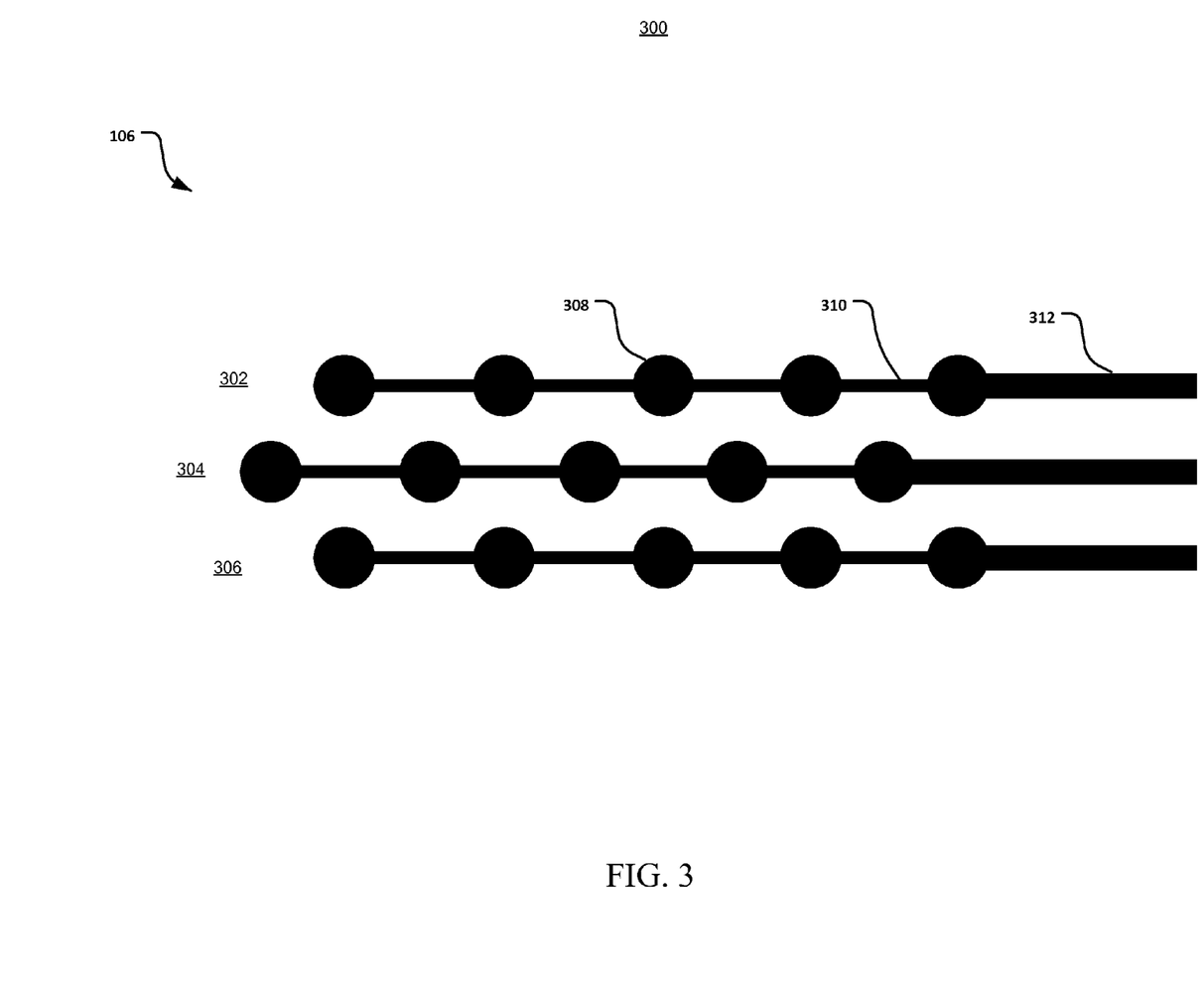
FIG. 3 illustrates a schematic diagram of another example embodiment of signal routing consistent with the present disclosure.

FIG. 3 illustrates a schematic diagram 300 of another example embodiment of signal routing 106 consistent with the present disclosure. The electrical coupling that is associated with crosstalk between adjacent signals in sockets, connectors, vias, microstrips and striplines is primarily inductive. The introduction of conductive metal pads 308 placed in the path of the signal lines (e.g., routing traces) 302, 304, 306 may provide additional capacitive coupling between adjacent signal lines (e.g., 302-304, 304-306). This additional capacitive coupling will tend to cancel the inductive coupling and reduce far end crosstalk at the receiving module. In some embodiments, the width of the signal lines may be reduced (e.g., 310 compared to 312) to compensate for the lower impedance of the signal lines resulting from the conductive pads 308.

Figure 4:
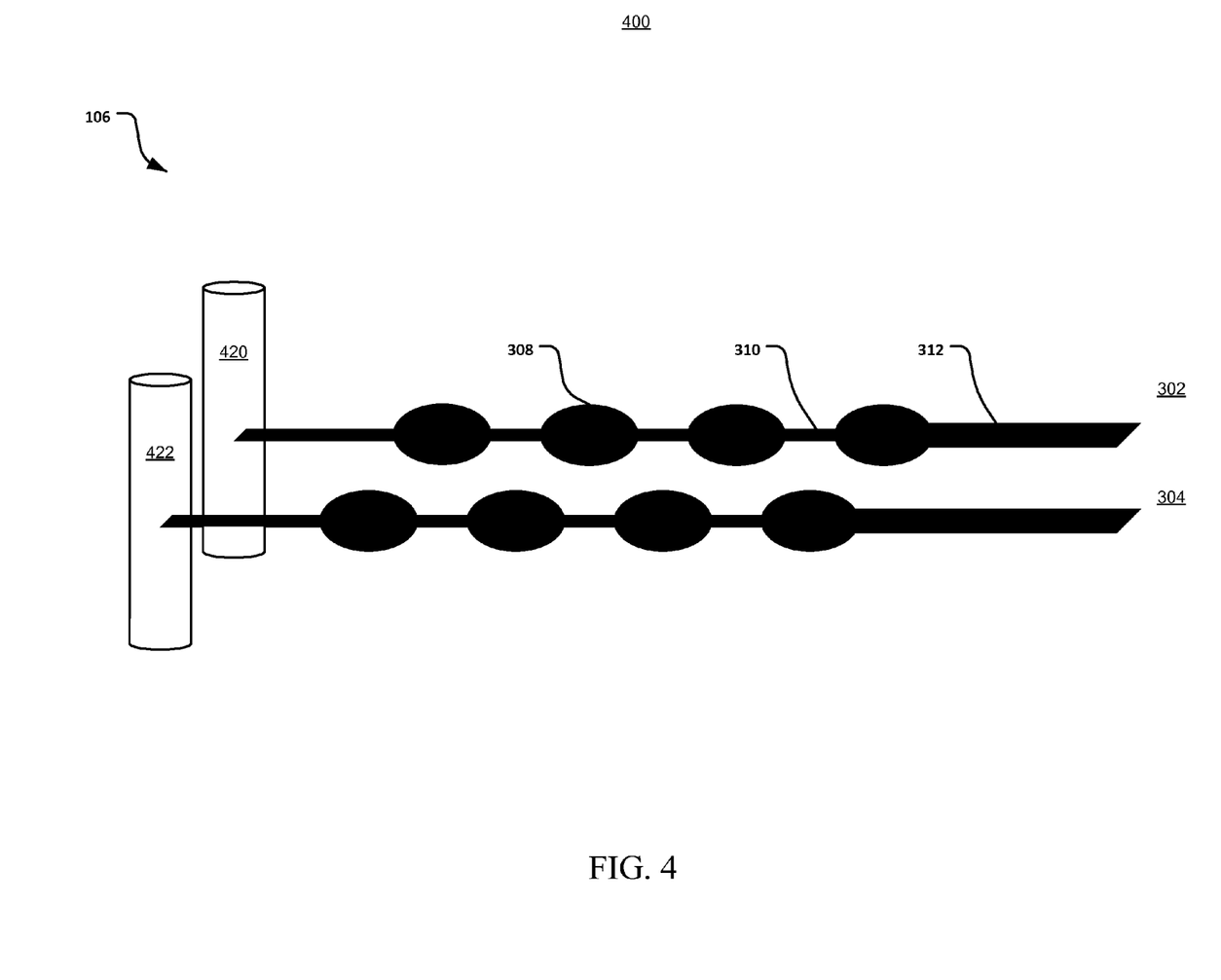
FIG. 4 illustrates a schematic diagram of another example embodiment of signal routing consistent with the present disclosure.

FIG. 4 illustrates a schematic diagram 400 of another example embodiment of signal routing 106 consistent with the present disclosure. Horizontal signal lines 302, 304 (e.g., within a plane of a routing layer) are shown coupled to vertical vias 420, 422 which may, for example, interconnect signal lines between different routing layers. Horizontal signal lines 302, 304 may similarly be coupled to vertical pins of a connector or socket. Thus, the coupling between signal lines and vias or pins may be a substantially perpendicular coupling. As described above, conductive metal pads 308 placed in the path of the signal lines (e.g., routing traces) 302, 304 may provide additional capacitive coupling between the adjacent signal lines to cancel the inductive coupling and reduce far end crosstalk at the receiving module. Similarly, the width of the signal lines may be reduced to compensate for the lower impedance resulting from the conductive pads 308.

Figure 5:
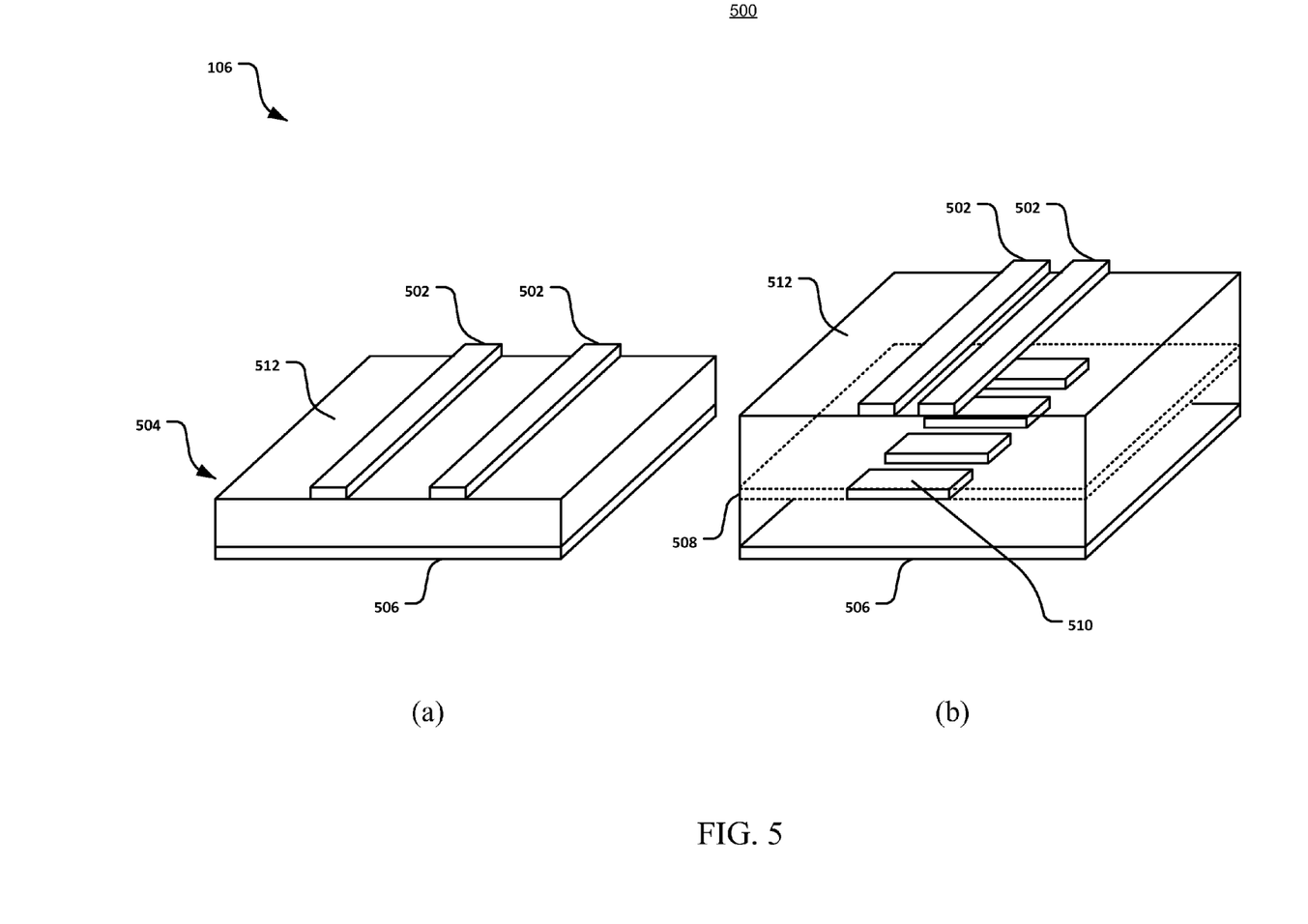
FIG. 5 illustrates a schematic diagram of another example embodiment of signal routing consistent with the present disclosure.

FIG. 5 illustrates a schematic diagram 500 of another example embodiment of signal routing consistent with the present disclosure. With reference first to FIG. 5(a) on the left, signal routing system 106 may be a routing structure 504, such as, for example a microstrip. Signal lines 502 may be disposed on a signal routing layer 512 of the microstrip 504. The microstrip 504 may also include a reference or ground plane layer 506. Far end crosstalk between signal lines 502 typically increases as spacing between the lines decreases, eventually resulting in a degradation of the signal to an unacceptable level. In fact, one general design rule has traditionally been that the minimum spacing between adjacent signal lines should exceed three times the width of the signal lines.

Transmission line analysis shows that a primary cause of far end cross talk is the difference in propagation speed between even mode and odd mode signals. Even mode signals arise when adjacent signal lines are switching synchronously and are carrying signals of the same polarity. Odd mode signals arise when adjacent signal lines are switching synchronously and are carrying signals of opposite polarity. Increasing the mutual capacitance between signal lines may reduce the propagation speed difference and thus reduce crosstalk, as will be explained in greater detail below. Turning now to FIG. 5(b), an additional conductor layer 508 is included, between the signal routing layer 512 and the reference layer 506, in which conductive patches 510 are deployed. These conductive patches 510 may extend between adjacent pairs of signal lines 502, for example in a direction substantially or at least partially perpendicular to the signal lines 502. Patches 510 may thus increase the mutual capacitance between signal lines 502. The additional conductor layer 508 may be parallel to the signal routing layer 512 and the reference layer 506.

The magnitude of the far end crosstalk voltage $V_f(t)$ may be calculated as follows:

$$V_f(t) = \frac{t_f}{2}\left(\frac{C_m}{C_s} - \frac{L_m}{L_s}\right)\frac{dV_i(t - t_f)}{dt}$$

where $C_s$, $C_m$, $L_s$ and $L_m$ are respectively the self-capacitance of a single line, the mutual capacitance between two lines, the self-inductance of a single line and the mutual inductance between two lines. Further, $t_f$ is the signal propagation time from the near end to the far end of the signal line and $V_i$ is the input signal voltage at the near end. For microstrip routing, typically $$\frac{C_m}{C_s} < \frac{L_m}{L_s}$$

and the difference between these two terms determines the far end crosstalk magnitude assuming that other factors remain constant. The conductive patches 510 increase the mutual capacitance $C_m$. Additionally, the self-capacitance $C_s$ may be reduced due to the increased distance of the signal lines 502 from the reference layer 506. In some embodiments, however, the signal line widths may be increased to maintain the characteristic impedance of the lines, in which case $C_s$ may remain unchanged. In either case, the ration of $C_m/C_s$ will be increased to match $L_m/L_s$, and as a result, the far end crosstalk, $V_f(t)$, will be reduced.

Figure 6:
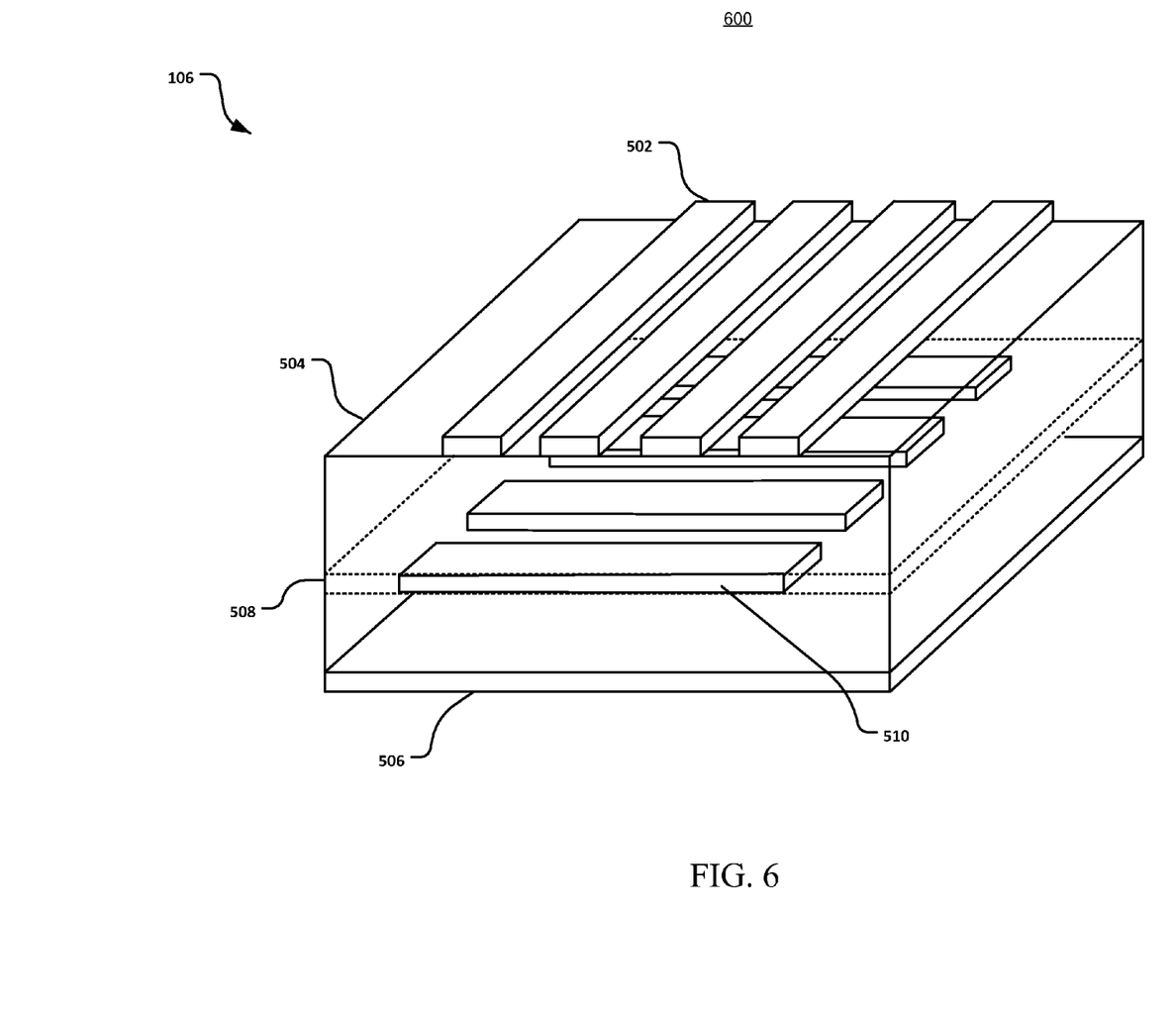
FIG. 6 illustrates a schematic diagram of another example embodiment of signal routing consistent with the present disclosure.

FIG. 6 illustrates a schematic diagram 600 of another example embodiment of signal routing consistent with the present disclosure. Although only two signal lines 502 are illustrated in FIG. 5(b), the use of conductive patches may be extended to any number of signal lines. FIG. 6 shows, for example, four signal lines 502 with conductive patches 510 that extend over substantially the entire distance from the leftmost signal line to the rightmost signal line.

Figure 7:
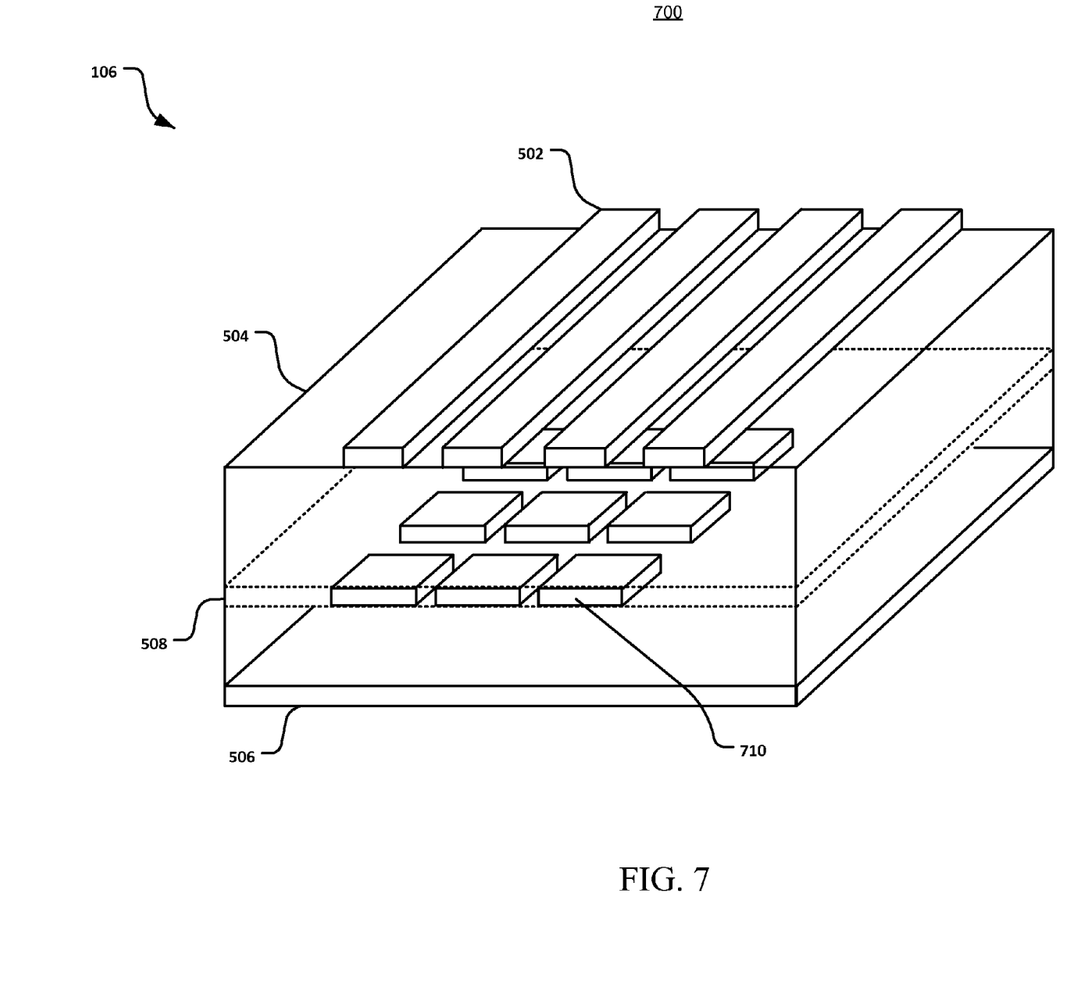
FIG. 7 illustrates a schematic diagram of another example embodiment of signal routing consistent with the present disclosure.

FIG. 7 illustrates a schematic diagram 700 of another example embodiment of signal routing consistent with the present disclosure. This example is similar to that of FIG. 6 except that the conductive patches are divided into segments 710. Each segment 710 provides mutual capacitance between two adjacent signal lines.

Figure 8:
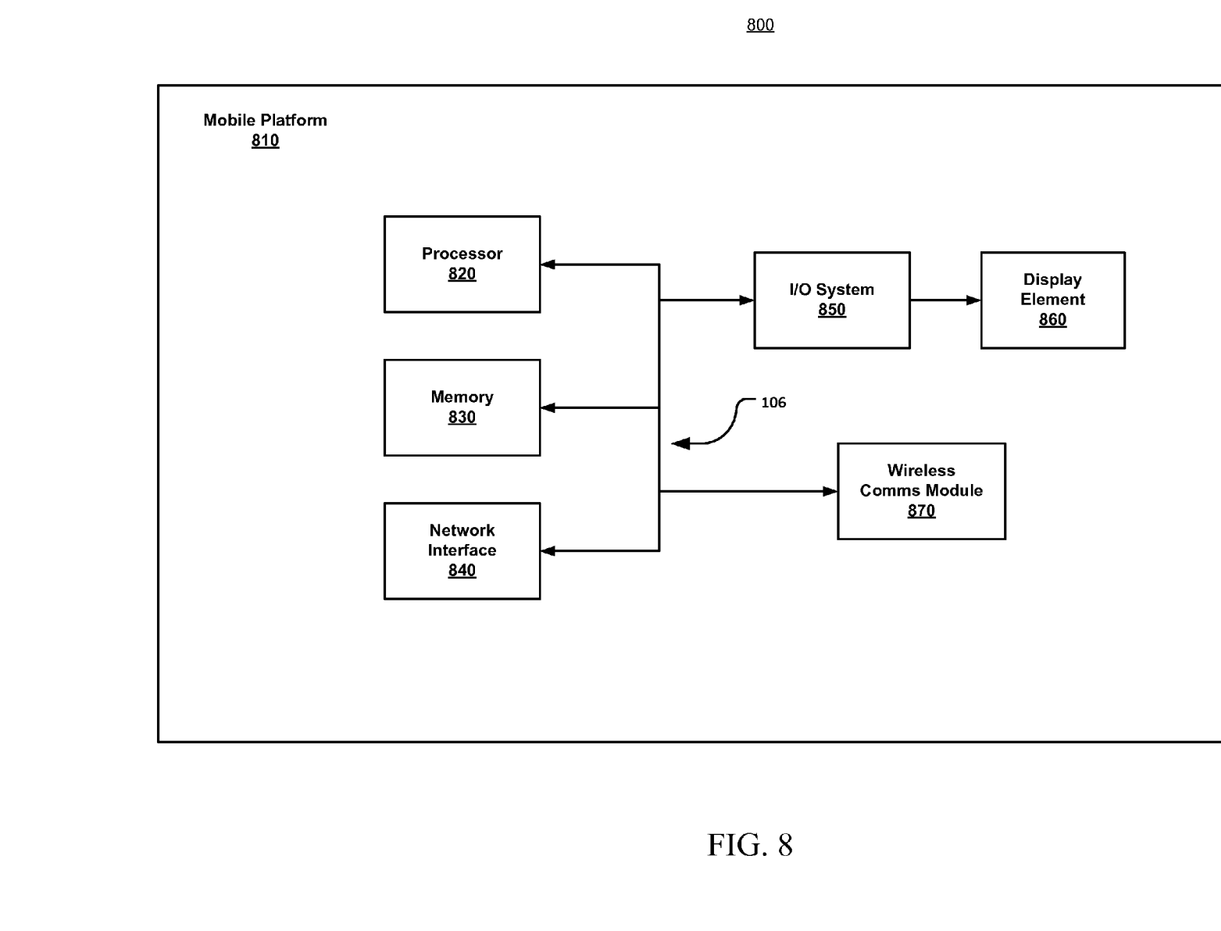
FIG. 8 illustrates a system diagram of a platform of another example embodiment consistent with the present disclosure.

FIG. 8 illustrates a system diagram 800 of one example embodiment consistent with the present disclosure. The system 800 may be a mobile platform 810 or computing device such as, for example, a smart phone, smart tablet, personal digital assistant (PDA), mobile Internet device (MID), convertible tablet, notebook or laptop computer, or any other suitable device. It will be appreciated, however, that embodiments of the system described herein are not limited to mobile platforms, and in some embodiments, the system 800 may be a workstation or desktop computer. The device may generally present various interfaces to a user via a display element 860 such as, for example, a touch screen, liquid crystal display (LCD) or any other suitable display type.

The system 800 is shown to include any number of processors 820, optionally including any number of GPUs or other specialized types of processors. In some embodiments, the processors 820 may be implemented as any number of processor cores. The processor (or processor cores) may be any type of processor, such as, for example, a microprocessor, an embedded processor, a digital signal processor (DSP), a network processor, a field programmable gate array or other device configured to execute code. The processors may be multithreaded cores in that they may include more than one hardware thread context (or "logical processor") per core. System 800 is also shown to include a memory 830 coupled to the processors. The memory 830 may be any of a wide variety of memories (including various layers of memory hierarchy and/or memory caches) as are known or otherwise available to those of skill in the art. It will be appreciated that the processors and memory may be configured to store, host and/or execute one or more user applications or other software modules. These applications may include, but not be limited to, for example, any type of computation, communication, data management, data storage and/or user interface task. In some embodiments, these applications may employ or interact with any other components of the mobile platform 810.

System 800 is also shown to include network interface module 840 which may include wireless communication capabilities, such as, for example, cellular communications, Wireless Fidelity (WiFi), Bluetooth®, and/or Near Field Communication (NFC). The wireless communications may conform to or otherwise be compatible with any existing or yet to be developed communication standards including past, current and future version of Bluetooth®, Wi-Fi and mobile phone communication standards.

System 800 is also shown to include an input/output (IO) system or controller 850 which may be configured to enable or manage data communication between processors 820 and other elements of system 800 or other elements (not shown) external to system 800.

System 800 is also shown to include signal routing 106, configured for reduced signal crosstalk, as described previously. The signal routing 106 may interconnect and provide communication between the various components of system 800. In some embodiments, the signal routing 106 may include microstrips, striplines, sockets, connectors and vias. In some embodiments, the system 800 and signal routing 106 may be incorporated on a printed circuit board.

It will be appreciated that in some embodiments, the various components of the system 800 may be combined in a system-on-a-chip (SoC) architecture. In some embodiments, the components may be hardware components, firmware components, software components or any suitable combination of hardware, firmware or software.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as, for example, processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may include, for example, singly or in any combination, hard-wired circuitry, programmable circuitry, state machine circuitry, and/or firmware that stores instructions executed by programmable circuitry. An app may be embodied as code or instructions which may be executed on programmable circuitry such as a host processor or other programmable circuitry. A module, as used in any embodiment herein, may be embodied as circuitry. The circuitry may be embodied as an integrated circuit, such as an integrated circuit chip.

Thus, the present disclosure provides systems and devices for reduction of crosstalk between routed signals. The following examples pertain to further embodiments.

According to Example 1 there is provided a system. The system may include a first pair of signal lines and a second pair of signal lines, and each of the pairs of signal lines include a positive signal line and a negative signal line to transmit a differential signal; a plurality of alternating current coupling capacitors (AC caps) each associated with one of the signal lines; and a routing crossover of the positive signal line and the negative signal line of the second pair of signal lines, to decrease signal crosstalk between the first and second pairs of signal lines, and the routing crossover includes one of the AC caps associated with the second pair of signal lines.

Example 2 may include the elements of the foregoing example, and the AC caps associated with the first pair of signal lines are located closer to an endpoint of the signal lines than to a midpoint of the signal lines.

Example 3 may include the elements of the foregoing example, and the routing crossover is located closer to a midpoint of the signal lines than to an endpoint of the signal lines.

Example 4 may include the elements of the foregoing example, and the routing crossover is located at a selected point along the signal lines, the selected point based on crosstalk generation by a circuit component coupled to the signal lines.

Example 5 may include the elements of the foregoing example, and the circuit component is a socket, connector, or via.

Example 6 may include the elements of the foregoing example, and the signal lines are incorporated in a microstrip or stripline.

Example 7 may include the elements of the foregoing example, and the signal lines are to electrically couple components of a printed circuit board.

Example 8 may include the elements of the foregoing example, and the printed circuit board is incorporated in a mobile platform.

According to Example 9 there is provided a system. The system may include a plurality of signal lines; and one or more conductive pads, and the signal lines include the conductive pads. The conductive pads configured to increase capacitive coupling between adjacent lines of the plurality of signal lines.

Example 10 may include the elements of the foregoing example, and widths of the plurality of signal lines are to compensate for reduced impedance associated with the conductive pads.

Example 11 may include the elements of the foregoing example, and size of the conductive pads, spacing between the conductive pads and/or number of the conductive pads are based on a target level of the signal crosstalk.

Example 12 may include the elements of the foregoing example, and the plurality of signal lines are routing traces.

Example 13 may include the elements of the foregoing example, and the plurality of signal lines are incorporated in a microstrip or stripline.

Example 14 may include the elements of the foregoing example, and the plurality of signal lines are perpendicularly coupled to a via, a socket pin or a connector pin.

Example 15 may include the elements of the foregoing example, and the plurality of signal lines are incorporated in a socket, connector, or via.

Example 16 may include the elements of the foregoing example, and the plurality of signal lines are to electrically couple components of a printed circuit board.

Example 16a may include the elements of the foregoing example, and the printed circuit board is incorporated in a mobile platform.

According to Example 17 there is provided a system. The system may include a plurality of signal lines disposed in a routing layer, the routing layer in a first plane; and one or more conductive patches disposed in a conductive layer, the conductive layer in a second plane parallel to the first plane, the conductive patches arranged to increase capacitive coupling between the signal lines to decrease signal crosstalk between the signal lines.

Example 18 may include the elements of the foregoing example, and the patches extend perpendicularly between pairs of adjacent lines of the plurality of signal lines.

Example 19 may include the elements of the foregoing example, and the patches extend perpendicularly between three or more adjacent lines of the plurality of signal lines.

Example 20 may include the elements of the foregoing example, and the patches are divided into segments, each of the segments to extend perpendicularly between adjacent pairs of lines of the plurality of signal lines.

Example 21 may include the elements of the foregoing example, and widths of the plurality of signal lines are to compensate for reduced impedance associated with placement of the conductive layer between the routing layer and a ground reference layer.

Example 22 may include the elements of the foregoing example, and the plurality of signal lines are incorporated in a microstrip or stripline.

Example 23 may include the elements of the foregoing example, and the plurality of signal lines are to electrically couple components of a printed circuit board.

Example 23a may include the elements of the foregoing example, and the printed circuit board is incorporated in a mobile platform.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A system comprising:
   a plurality of signal lines disposed in a routing layer, said routing layer in a first plane; and
   one or more conductive patches disposed in a conductive layer, said conductive layer in a second plane parallel to said first plane, said conductive patches arranged to increase capacitive coupling between said signal lines to decrease signal crosstalk between said signal lines, wherein widths of said plurality of signal lines are to compensate for reduced impedance associated with placement of said conductive layer between said routing layer and a ground reference layer.

2. The system of claim 1, wherein said patches extend perpendicularly between pairs of adjacent lines of said plurality of signal lines.

3. The system of claim 1, wherein said patches extend perpendicularly between three or more adjacent lines of said plurality of signal lines.

4. The system of claim 1, wherein said patches are divided into segments, each of said segments to extend perpendicularly between adjacent pairs of lines of said plurality of signal lines.

5. The system of claim 1, wherein said plurality of signal lines are incorporated in a microstrip or stripline.

6. The system of claim 1, wherein said plurality of signal lines are to electrically couple components of a printed circuit board.

* * * * *